United States Patent
Xie et al.

(10) Patent No.: US 10,177,247 B2
(45) Date of Patent: Jan. 8, 2019

(54) CONTINUOUS CRYSTALLINE GALLIUM NITRIDE (GAN) PN STRUCTURE WITH NO INTERNAL REGROWTH INTERFACES

(71) Applicant: Qorvo US, Inc., Greensboro, NC (US)

(72) Inventors: Jinqiao Xie, Allen, TX (US); Xing Gu, Allen, TX (US); Edward A. Beam, III, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/681,597

(22) Filed: Aug. 21, 2017

(65) Prior Publication Data
US 2018/0212045 A1    Jul. 26, 2018

Related U.S. Application Data

(60) Provisional application No. 62/448,477, filed on Jan. 20, 2017.

(51) Int. Cl.
H01L 29/00 (2006.01)
H01L 21/70 (2006.01)
(Continued)

(52) U.S. Cl.
CPC .... *H01L 29/66909* (2013.01); *H01L 21/0262* (2013.01); *H01L 21/02389* (2013.01);
(Continued)

(58) Field of Classification Search
CPC ......... H01L 29/66909; H01L 29/66924; H01L 29/7813; H01L 29/8083; H01L 29/0649; H01L 29/66734; H01L 21/02647; H01L 29/66446; H01L 21/02389; H01L 21/0262; H01L 21/02631; H01L 29/2003;
(Continued)

(56) References Cited

U.S. PATENT DOCUMENTS

| 2006/0049433 A1* | 3/2006 | Hasegawa | B82Y 20/00 257/257 |
| 2013/0032779 A1* | 2/2013 | Huang | H01L 33/007 257/13 |
| 2014/0131721 A1* | 5/2014 | Nie | H01L 29/66909 257/76 |

OTHER PUBLICATIONS

Chowdhury, Srabanti, et al., "Current Status and Scope of Gallium Nitride-Based Vertical Transistors for High-Power Electronics Application," Semiconductor Science and Technology, vol. 28, No. 7, Jun. 21, 2013, 8 pages.

* cited by examiner

*Primary Examiner* — Su C Kim
(74) *Attorney, Agent, or Firm* — Withrow & Terranova, P.L.L.C.

(57) ABSTRACT

A precursor cell for a transistor having a foundation structure, a mask structure, and a gallium nitride (GaN) PN structure is provided. The mask structure is provided over the foundation structure to expose a first area of a top surface of the foundation structure. The GaN PN structure resides over the first area and at least a portion of the mask structure and has a continuous crystalline structure with no internal regrowth interfaces. The GaN PN structure comprises a drift region over the first area, a control region laterally adjacent the drift region, and a PN junction formed between the drift region and the control region. Since the drift region and the control region form the PN junction having no internal regrowth interfaces, the GaN PN structure has a continuous crystalline structure with reduced regrowth related defects at the interface of the drift region and the control region.

21 Claims, 14 Drawing Sheets

(51) Int. Cl.
*H01L 29/66* (2006.01)
*H01L 21/02* (2006.01)
*H01L 29/78* (2006.01)
*H01L 29/06* (2006.01)
H01L 29/808 (2006.01)
H01L 27/146 (2006.01)
H01L 29/10 (2006.01)
H01L 29/20 (2006.01)

(52) U.S. Cl.
CPC .. *H01L 21/02631* (2013.01); *H01L 21/02647* (2013.01); *H01L 29/0649* (2013.01); *H01L 29/66446* (2013.01); *H01L 29/66734* (2013.01); *H01L 29/66924* (2013.01); *H01L 29/7813* (2013.01); *H01L 29/8083* (2013.01); H01L 27/14679 (2013.01); H01L 29/1066 (2013.01); H01L 29/1095 (2013.01); H01L 29/2003 (2013.01); H01L 29/66893 (2013.01); H01L 29/8086 (2013.01); H01L 2924/13062 (2013.01)

(58) Field of Classification Search
CPC ............. H01L 29/1066; H01L 29/1095; H01L 29/66893; H01L 29/8086; H01L 2924/13062; H01L 27/14679
See application file for complete search history.

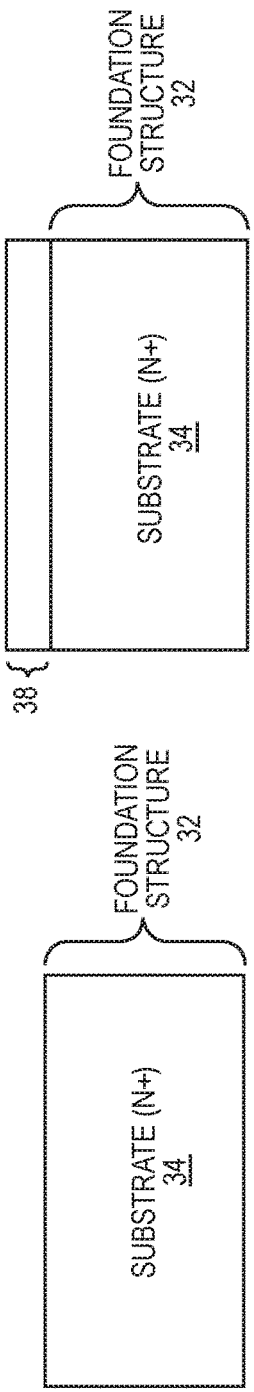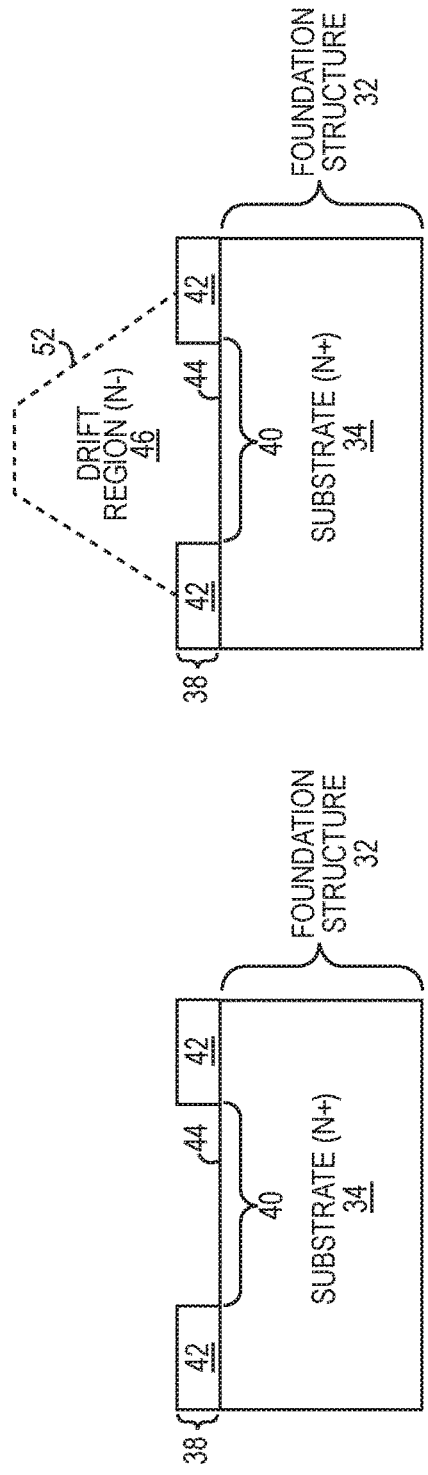
FIG. 8A  FIG. 8B  FIG. 8C  FIG. 8D

US 10,177,247 B2

CONTINUOUS CRYSTALLINE GALLIUM NITRIDE (GAN) PN STRUCTURE WITH NO INTERNAL REGROWTH INTERFACES

PRIORITY APPLICATION

This application claims the benefit of U.S. provisional patent application Ser. No. 62/448,477, filed Jan. 20, 2017 and entitled "METHOD TO MANUFACTURE GAN BASED JUNCTION FIELD EFFECT TRANSISTOR," the disclosure of which is hereby incorporated herein by reference in its entirety.

FIELD OF THE DISCLOSURE

The technology of the disclosure relates generally to semiconductor devices and more particularly to fabricating gallium nitride (GaN) semiconductor devices.

BACKGROUND

Vertical transistors are a class of semiconductor devices characterized by a vertical conduction path that extends generally from the top of a device to the bottom. Compared with more traditional transistors, which have horizontal conduction paths, generally vertical channel structures allow for both a high blocking voltage and a high on-state current, making such devices well suited for high-power applications.

One example of a vertical transistor is the vertical junction field-effect transistor (JFET) 10 illustrated in FIG. 1. The vertical JFET 10 is an example of an N-channel depletion mode device, which means that the device is in its on-state when no charge is applied to the gate contacts 12 (G). In its on-state, the gate contacts 12 (G) above the P-doped control regions 14 are under forward bias, and do not deplete the N-doped drift region 16. In this state, current can flow between the source contact 18 (S) and the drain contact 20 (D), across the substrate 22, drift layer 24, and drift region 16. To block this current, a negative bias can be applied to the gate contacts 12 (G), causing depletion of the drift region 16. Thus reducing or eliminating the on-state current and switching the vertical JFET 10 to its off-state. Conventional vertical metal oxide semiconductor field-effect transistors (MOSFETs) are similar to the vertical JFET 10 of FIG. 1; however, the vertical MOSFETs are normally in an off-state.

Gallium nitride (GaN) is a III-V semiconductor material with a wide bandgap, very high breakdown voltages, and high electron mobility, making it an ideal candidate for use in high-power devices such as the vertical JFET 10 illustrated in FIG. 1. However, current fabrication techniques used for vertical GaN devices requiring several regrowth steps are often inefficient or can result in PN junctions having high defect densities at interfaces between P-doped regions and N-doped regions due to the regrowth. Since dislocations typically provide current leakage paths for vertical transistors, bulk GaN substrates with a low number of dislocation densities are conventionally used for fabricating vertical transistors. However, the regrowth of N-doped GaN regions on P-doped GaN surfaces can introduce chemical contaminants and other damage related with the dry etching process and the cleaning process. These chemical contaminants and process related damage can increase impurity backgrounds and create point defects that produce leakage paths at the regrowth surfaces, resulting in devices that suffer from high current leakages and lower breakdown voltages. Therefore, there is a need for an efficient fabrication technique that reduces or eliminates interface defects at PN junctions in vertical transistors, and in particular, GaN-based transistors.

SUMMARY

The present disclosure relates to continuous crystalline gallium nitride (GaN) PN structures with no internal regrowth interfaces. Related devices, methods, and systems are also disclosed. According to an exemplary device, a precursor cell for a transistor having a foundation structure, a mask structure, and a GaN PN structure is disclosed. The mask structure is provided over the foundation structure so as to expose a first area of a top surface of the foundation structure. The GaN PN structure resides over the first area and at least a portion of the mask structure and has a continuous crystalline structure with no internal regrowth interfaces. The GaN PN structure comprises a drift region over the first area doped with a first dopant of a first polarity and a control region doped with a second dopant of a second polarity laterally adjacent the drift region, wherein the first polarity is opposite the second polarity. The GaN PN structure also comprises a PN junction formed between the drift region and the control region. Since the drift region and the control region form the PN junction having no internal regrowth interfaces, the GaN PN structure has a continuous crystalline structure with reduced regrowth related defects at the interface of the drift region and the control region. These characteristics help to reduce or eliminate device weaknesses, such as current leakages and low breakdown voltages, allowing for more reliable and efficient devices. Other material systems may benefit from the concepts disclosed herein.

According to an exemplary method, forming a precursor cell for a transistor having a foundation structure, a mask structure, and a GaN PN structure is disclosed. The foundation structure doped with a dopant of a first polarity is provided. The mask structure is formed over a top surface of the foundation structure so as to expose a first area of the top surface of the foundation structure. The GaN PN structure having a continuous crystalline structure with no internal regrowth interfaces is formed in a continuous growth phase over the first area and at least a portion of the mask structure. Forming the GaN PN structure in the continuous growth phase includes regrowing a drift region of the GaN PN structure doped with a dopant of the first polarity in a substantially vertical direction over the first area and then growing a control region doped with a dopant of a second polarity in a substantially lateral direction such that the control region is laterally adjacent the drift region. In aspects disclosed herein, the first polarity is opposite the second polarity. In other aspects disclosed herein, the PN junction is formed to have no internal regrowth interfaces between the drift region and the control region.

Exemplary aspects disclosed herein also include a regrowth interface between the foundation structure and the GaN PN structure. Exemplary aspects wherein the foundation structure comprises a substrate doped with a dopant of the first polarity and the drift region and the mask structure are directly on the substrate are also included. In some exemplary aspects, the substrate and the drift layer are made of GaN. In other exemplary aspects, the GaN PN structure is grown using metal-organic chemical vapor deposition (MOCVD) or Hydride Vapor Phase Epitaxy (HVPE). Additional exemplary aspects include regrowing the drift region in a substantially vertical direction while simultaneously doping the drift region with a dopant of the first polarity. Some aspects also include using epitaxial lateral overgrowth (ELO) to promote a substantially lateral overgrowth of the GaN PN structure while simultaneously doping the control region with a dopant of the second polarity. Exemplary aspects disclosed herein also include a drain contact over a bottom surface of the substrate, where the bottom surface of the substrate is opposite the top surface of the substrate, a gate contact over the control region, and a source contact over the drift region. Aspects also include the foundation structure having a supplemental gate contact over a supplemental control region, wherein the supplemental control region is doped with a dopant of the second polarity.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawings incorporated in and forming a part of this specification illustrate several aspects of the disclosure and, together with the description, serve to explain the principles of the disclosure.

FIGS. 8A-8F illustrate an exemplary process for fabricating the vertical JFET shown in FIG. 7;

DETAILED DESCRIPTION

Figure 1:
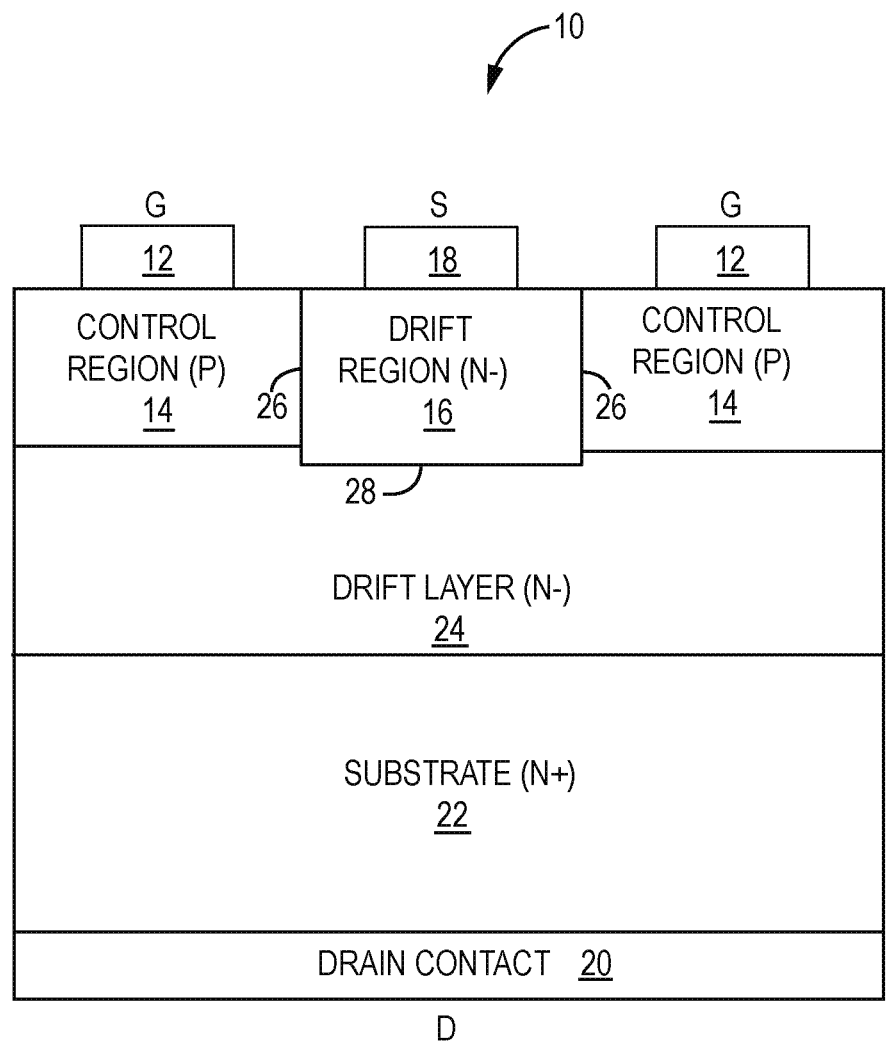
FIG. 1 is a schematic diagram of a conventional vertical junction field-effect transistor (JFET), according to the related art.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to continuous crystalline gallium nitride (GaN) PN structures with no internal regrowth interfaces. Related devices, methods, and systems are also disclosed. According to an exemplary device, a precursor cell for a transistor having a foundation structure, a mask structure, and a GaN PN structure is disclosed. The mask structure is provided over the foundation structure so as to expose a first area of a top surface of the foundation structure. The GaN PN structure resides over the first area and at least a portion of the mask structure and has a continuous crystalline structure with no internal regrowth interfaces. The GaN PN structure comprises a drift region over the first area doped with a first dopant of a first polarity and a control region doped with a second dopant of a second polarity laterally adjacent the drift region, wherein the first polarity is opposite the second polarity. The GaN PN structure also comprises a PN junction formed between the drift region and the control region. Since the drift region and the control region form the PN junction having no internal regrowth interfaces, the GaN PN structure has a continuous crystalline structure with reduced regrowth related defects at the interface of the drift region and the control region. These characteristics help to reduce or eliminate device weaknesses such as current leakages and low breakdown voltages, allowing for more reliable and efficient devices. Other material systems may benefit from the concepts disclosed herein.

Figure 2:
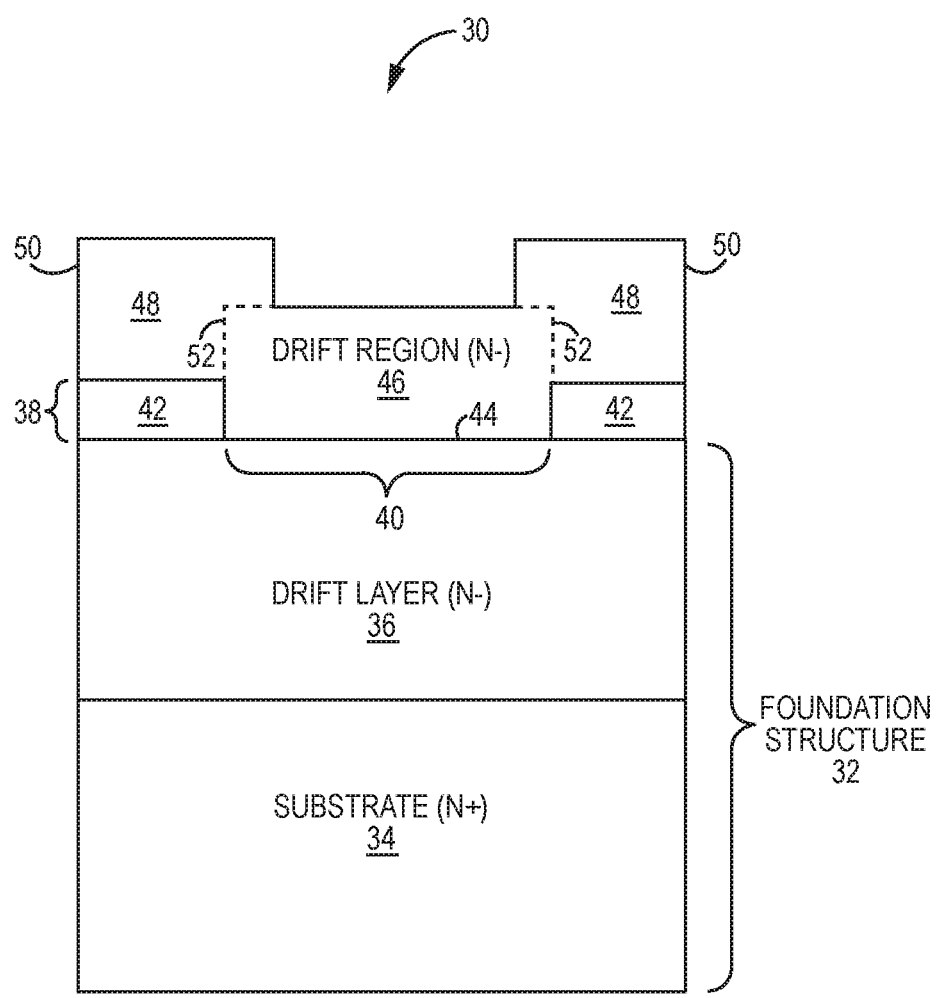
FIG. 2 is a schematic diagram of an exemplary vertical semiconductor device in the form of a precursor cell for a transistor having a PN junction with no internal regrowth interfaces, wherein the precursor cell can be further developed into a vertical JFET or vertical metal oxide semiconductor field-effect transistor (MOSFET)

FIG. 2 illustrates a schematic diagram of an exemplary vertical semiconductor device in the form of a precursor cell 30 for a transistor. The precursor cell 30 has a foundation structure 32 including a heavily (N+) doped substrate 34 below a more lightly (N−) doped drift layer 36. Over the drift layer 36 is a mask layer 38, which exposes a first area 40 of a top surface of the foundation structure 32 between two portions of a mask structure 42. A horizontal regrowth interface 44 exists between the first area 40 of the top surface of the foundation structure 32 and a lightly (N−) doped GaN drift region 46 at the first area 40. The drift region 46 is positioned over the first area 40 and at least a portion of the mask structure 42 and is laterally adjacent to two portions of a P-doped GaN control region 48. The drift region 46 and the control region 48 form a GaN PN structure 50.

Within the GaN PN structure 50 are two PN junctions 52, each formed at an interface between the drift region 46 and one portion of the control region 48. Each PN junction 52 has no internal regrowth interface. As a result, there are few crystallographic defects at each interface compared to GaN PN structures fabricated by conventional regrowth methods. By reducing or eliminating defect densities at each PN junction 52, the GaN PN structure 50 is able to provide a continuous crystalline structure. Providing the GaN PN structure 50 with the continuous crystalline structure allows for more control over current across the device. In this regard, it is possible to provide devices with reduced current leakage and higher breakdown voltages compared to conventional devices using GaN PN structures, which often have defective PN junction interfaces. In this manner, the precursor cell 30 shown in FIG. 2 allows for devices using GaN PN structures to be both more reliable and efficient.

Figure 3A:
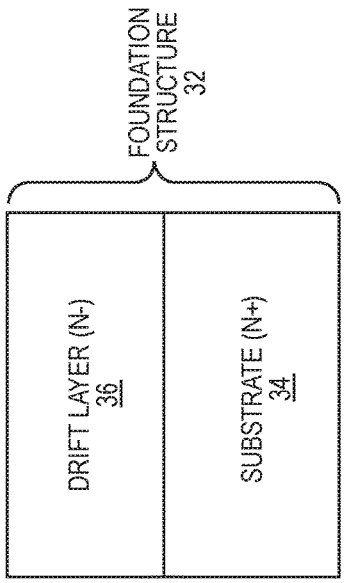
FIGS. 3A-3F illustrate an exemplary process for fabricating the precursor cell shown in FIG. 2.
Figure 3B:
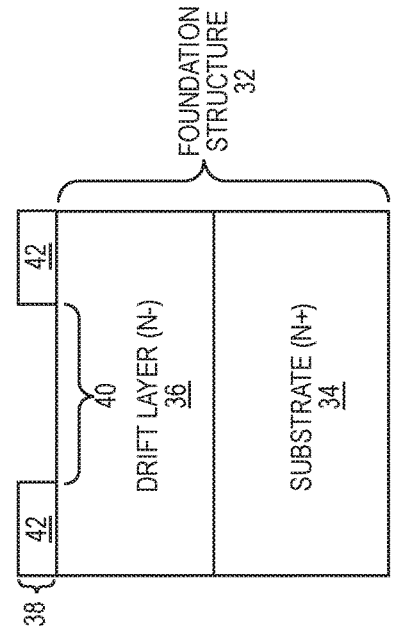
Figure 3C:
Figure 3D:
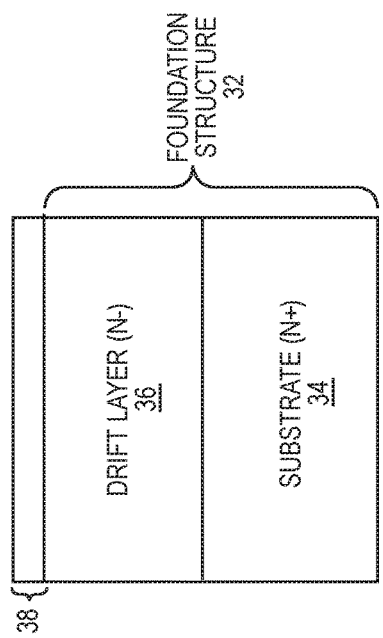

FIGS. 3A-3F illustrate a process for fabricating the precursor cell 30 of FIG. 2. With regard to FIGS. 3A-3D, the foundation structure 32 is initially formed by providing the substrate 34. Next, the drift layer 36 is formed over the substrate 34, and the mask layer 38 is formed over the drift layer 36, as shown in FIGS. 3B-3C. The mask layer 38 is then etched to have an opening that exposes the first area 40 of the top surface of the foundation structure 32 between two portions of the resultant mask structure 42, as shown in FIG. 3D.

Figure 3E:
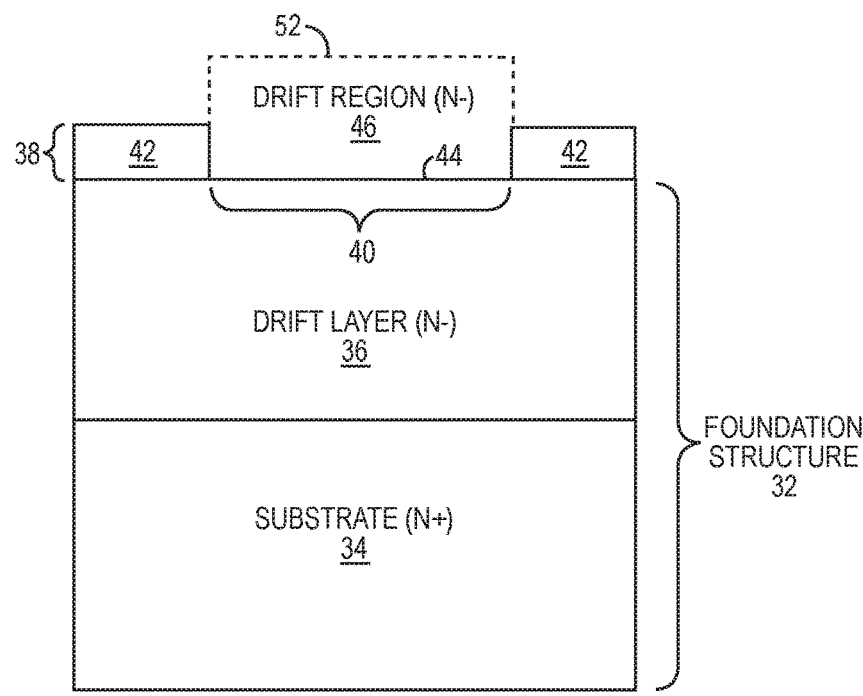
Figure 3F:
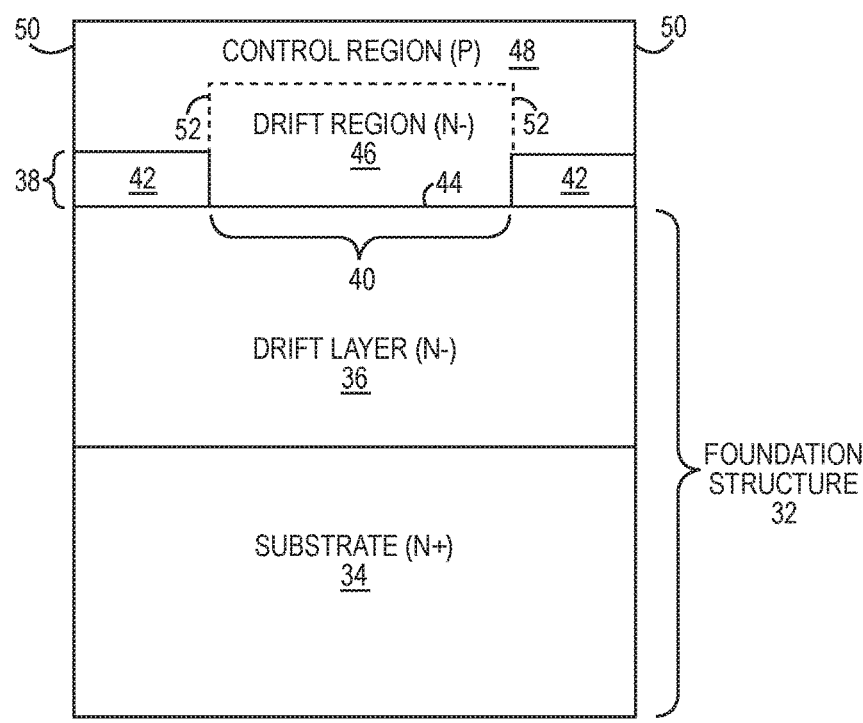

With reference to FIGS. 3E-3F, the first area 40 is then used as the horizontal regrowth interface 44 upon which the drift region 46 and the laterally adjacent control region 48 are grown during a continuous growth phase. In FIGS. 3E-3F, the dashed lines indicate the PN junction 52 formed between the drift region 46 and the control region 48. Once the control region 48 is regrown, a portion of the control region 48 over the drift region 46 may be removed to form the precursor cell 30 of FIG. 2. The drift region 46 may be formed using methods such as metal-organic chemical vapor deposition (MOCVD) or Hydride Vapor Phase Epitaxy (HVPE). In contrast to other deposition processes, such as molecular beam epitaxy (MBE), MOCVD and/or HVPE allows for the growth of single crystalline films having fewer structural defects and a higher lateral growth rate. With regard to FIGS. 3A-3F, the control region 48 grows from the drift region 46 as a second part of a single, continuous growth phase. The continuous growth of the control region 48 is enabled by using epitaxial lateral overgrowth (ELO). Conventional ELO is a technique which can induce lateral growth of certain materials, such as GaN, and bend and annihilate dislocations. Since the drift region 46 and the control region 48 make up the component parts of the GaN PN structure 50, combining aspects of MOCVD and ELO allow for the GaN PN structure 50 to have the continuous crystalline structure with reduced defect densities. These features help reduce or eliminate device weaknesses, such as current leakages and low breakdown voltages, allowing for the creation of devices that are more reliable and efficient.

One area particularly vulnerable to the defect densities in conventionally fabricated GaN PN structures such as the GaN PN structure 50 is the PN junction 52. This weakness occurs because some conventional fabrication techniques require ex situ etching and cleaning in between growing the drift region 46 and growing the control region 48. Such etching and cleaning can expose the PN junction 52 to chemical contaminants, which in turn can increase impurity backgrounds and/or ion damages and create point defects at the PN junction 52, thus increasing the total defect densities at the PN junction 52. In the present disclosure these issues are avoided by using MOCVD (or HVPE) and ELO methods that decouple the regrowth interface from the PN junction interface to form the PN junction 52, and therefore do not subject the PN junction 52 to ex situ processes. By not subjecting the PN junction 52 to such ex situ processes, the high density of defects present in devices fabricated using conventional methods can be reduced or eliminated, thus reducing the total defect density at the PN junction 52. In this manner, continuous crystalline GaN PN structures having no internal regrowth interfaces can be formed, allowing for more reliable and efficient transistor-based devices.

The substrate 34 may be made of GaN, SiC, and/or Si, and may have a thickness ranging from 100 micrometers (μm) to 1 millimeter (mm). In some embodiments, the drift layer 36 may be formed from GaN, InGaN, and/or AlGaN, and may have a thickness ranging from 1 μm to 100 μm. The mask layer 38 may be formed from SiOx, SiNx, and/or AlOx, and may have a thickness ranging from 10 nanometers (nm) to 500 nm. Chemistries used for etching the mask layer 38 may include SF6, CF4, and/or Ar. The opening exposing the first area 40 of the top surface of the foundation structure 32 between the two portions of the resultant mask structure 42 may have a width that ranges from 100 nm to 10 μm.

In some embodiments disclosed herein, the substrate 34 may be doped with a dopant such as Si and/or Ge, as examples, and may have doping concentrations that range from $1\times10^{17}$ cm$^{-3}$ to $1\times10^{20}$ cm$^{-3}$, as examples. The drift layer 36 may be doped with a first dopant of the first polarity, such as Si and/or Ge, as examples, and may have doping concentrations that range from $1\times10^{14}$ cm$^{-3}$ to $1\times10^{17}$ cm$^{-3}$, as examples. The drift region 46 may be doped with Si and/or Ge, as examples, and may have doping concentrations that range from $1\times10^{14}$ cm$^{-3}$ to $1\times10^{17}$ cm$^{-3}$, as examples. The control region 48 may be doped with Mg, as an example, and may have doping concentrations that range from $1\times10^{18}$ cm$^{-3}$ to $1\times10^{20}$ cm$^{-3}$, as examples. Dopants may be introduced to the control region 48 during ELO process phases using methods such as MOCVD, as an example. Throughout this disclosure, a first dopant having a first polarity can include any charged particle having a net positive or a net negative charge used for doping a material. Similarly, throughout this disclosure, a second dopant having a second polarity can include any charged particle having a net positive or a net negative charge used for doping a material. In some embodiments, the drift region 46 may have thicknesses ranging from 100 nm to 100 µm, as examples. In some embodiments, the control region 48 may have thicknesses ranging from 100 nm to 10 µm, as examples. In some embodiments disclosed herein, the GaN PN structure 50 may have a defect density less than $1\times10^7$ cm$^{-2}$, as an example. In some embodiments, the GaN PN structure 50 may have impurity backgrounds less than $1\times10^{17}$ cm$^{-3}$, as an example.

Figure 4:
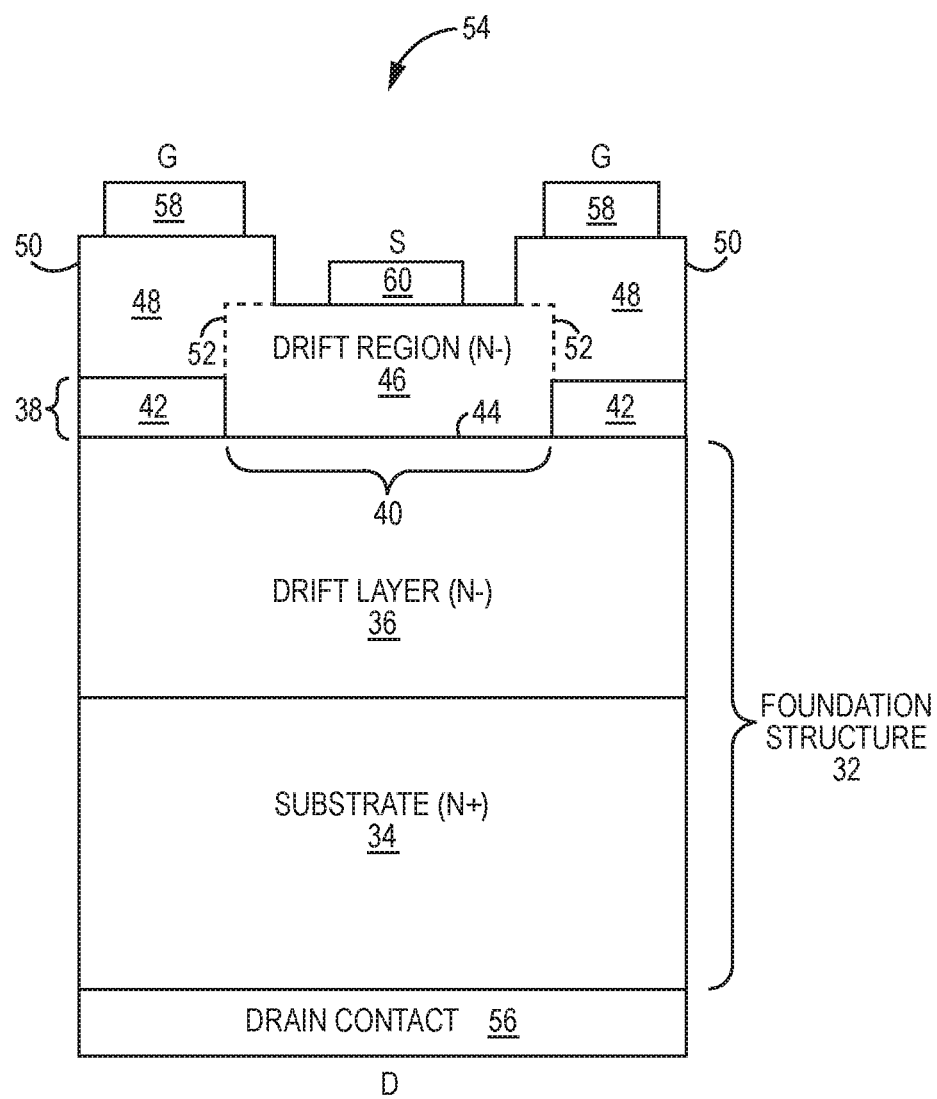
FIG. 4 is a schematic diagram of an exemplary vertical JFET having PN junctions with no internal regrowth interfaces and including a precursor cell and drain, source, and gate contacts.

FIG. 4 illustrates an exemplary vertical junction field-effect transistor (JFET) 54 formed from the precursor cell 30 illustrated in FIG. 2 having the GaN PN structure 50 with no internal regrowth interfaces. The vertical JFET 54 may be fabricated by attaching a drain contact 56 (D), two gate contacts 58 (G), and a source contact 60 (S) to a bottom surface of the substrate 34, top surfaces of the control region 48, and a top surface of the drift region 46 of the precursor cell 30, respectively. Using the GaN PN structure 50 having no internal regrowth interfaces allows the vertical JFET 54 to reduce current leakages and increase voltage breakdown levels, resulting in a more reliable and efficient device with a better on/off ratio. Since the vertical JFET 54 is fabricated from the precursor cell 30 illustrated in FIG. 2, discussed above, the benefits and features disclosed above with regard to the precursor cell 30 also apply to the vertical JFET 54.

In some embodiments, the vertical JFET 54 of FIG. 4 may be able to withstand reverse bias voltages ranging greater than 100 V. The drain contact 56 (D) can be formed using processes such as thermal evaporation and/or sputtering.

Figure 5:
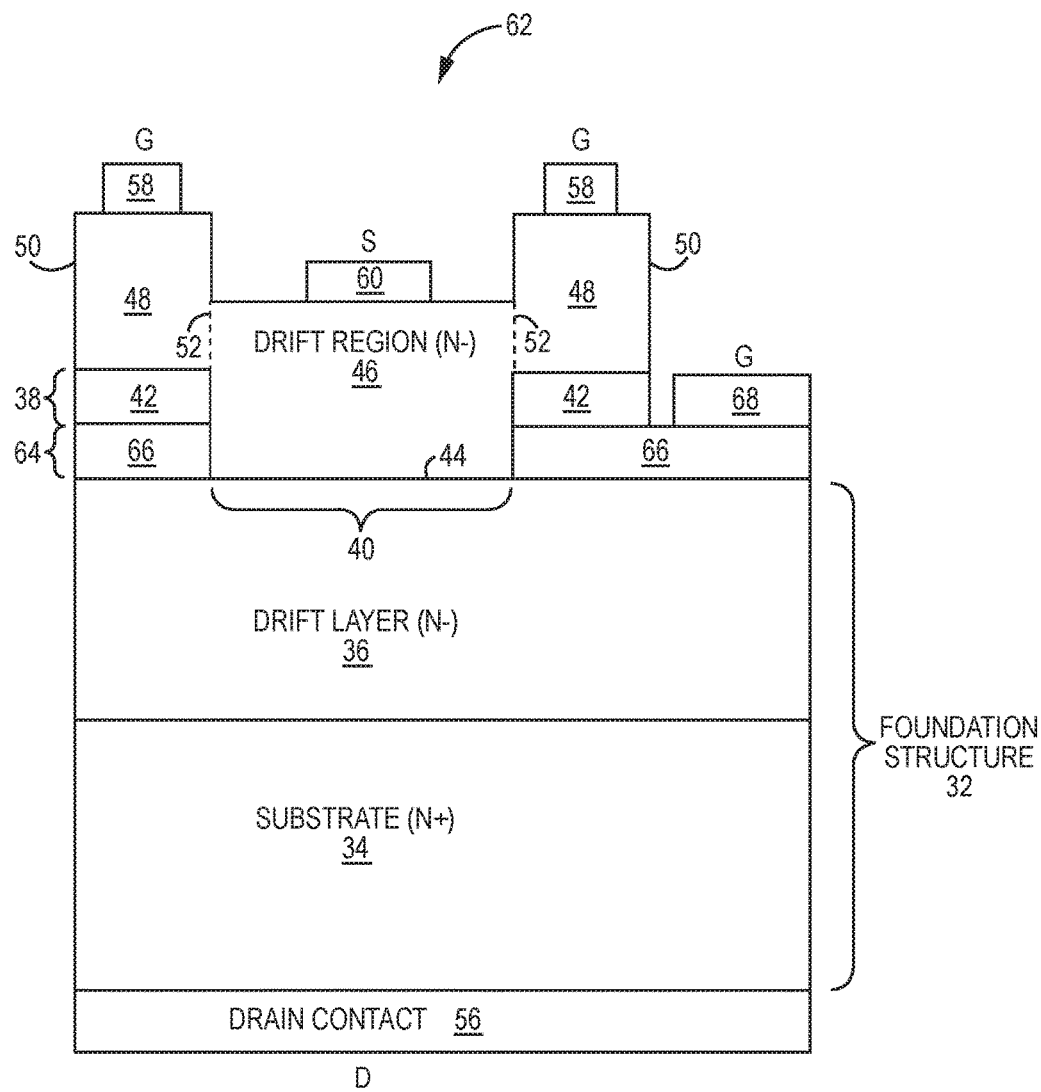
FIG. 5 is a schematic diagram of an exemplary vertical JFET having PN junctions with no internal regrowth interfaces and including a precursor cell, drain, source, and gate contacts, and supplemental control regions for providing enhanced device control.

FIG. 5 illustrates another exemplary vertical JFET 62 formed from the precursor cell 30 illustrated in FIG. 2 having the GaN PN structure 50 with no internal regrowth interfaces. The vertical JFET 62 of FIG. 5 differs from the vertical JFET 54 of FIG. 4 in that the vertical JFET 62 of FIG. 5 has a supplemental control layer 64 over the drift layer 36 and below the mask structure 42. A P-doped supplemental control region 66 is formed from the supplemental control layer 64 and allows for enhanced device control, as it provides a second region at which the current channel can be closed. To close the current channel, a positive charge can be applied to a supplemental gate contact 68.

Figure 6B:
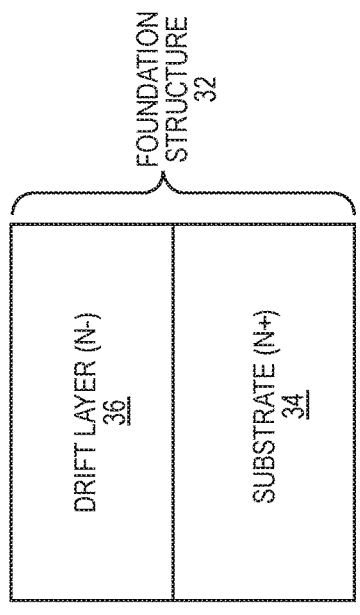
FIGS. 6A-6I illustrate an exemplary process for fabricating the vertical JFET shown in FIG. 5.
Figure 6D:
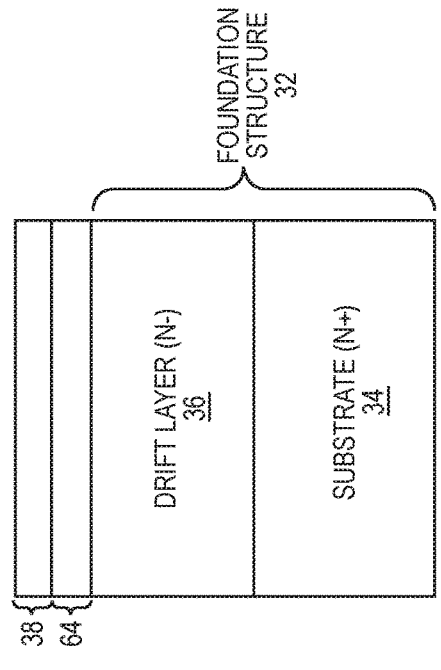
Figure 6A:
Figure 6C:
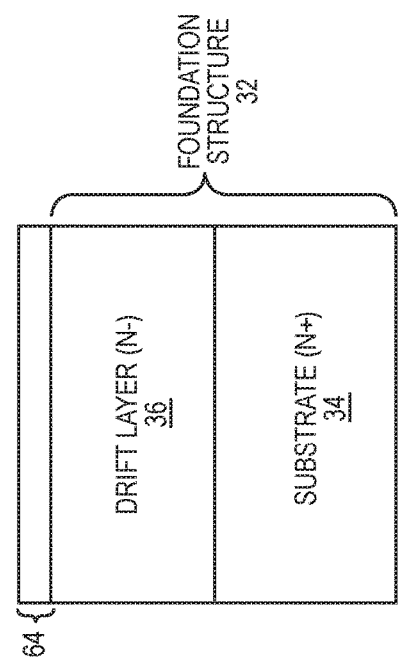
Figure 6E:
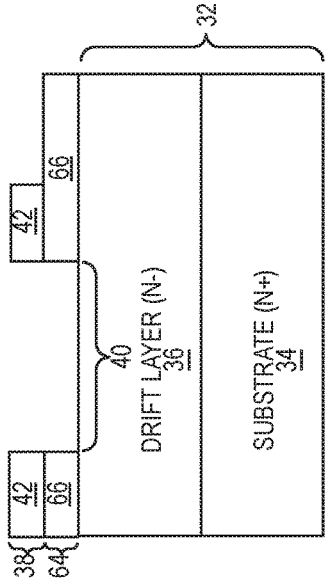
Figure 6F:
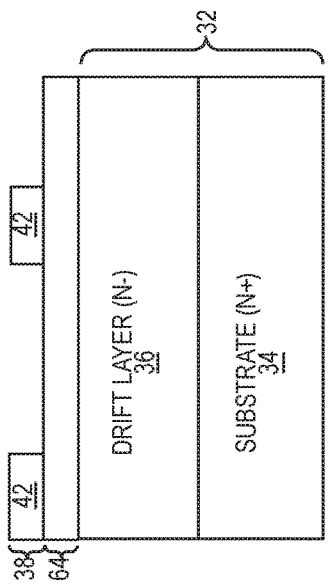

As illustrated in FIGS. 6A-6I, the vertical JFET 62 of FIG. 5 may be fabricated in a process similar to the process illustrated in FIGS. 3A-3F for fabricating the precursor cell 30 of FIG. 2. However, in contrast to the process illustrated in FIGS. 3A-3F, FIGS. 6A-6I introduce the supplemental control layer 64 from which the supplemental control region 66 is formed. With regard to FIGS. 6A-6D, the foundation structure 32 is initially formed by providing the substrate 34. Next, the drift layer 36 is formed over the substrate 34, and the supplemental control layer 64 is formed over the drift layer 36, as shown in FIGS. 6B-6C. The mask layer 38 is then formed over the supplemental control layer 64, as illustrated in FIG. 6D. A portion of the mask layer 38 and a portion of the supplemental control layer 64 are then removed to expose the first area 40 of the top surface of the foundation structure 32, as illustrated in FIGS. 6E-6F. Further, a portion of the mask layer 38 is removed to expose a top surface of the supplemental control region 66. As discussed below, the supplemental gate contact 68 (G) can be formed on this exposed top surface of the supplemental control region 66. In this manner, the supplemental control region 66 and the mask structure 42 are formed from the supplemental control layer 64 and the mask layer 38, respectively.

Figure 6G:
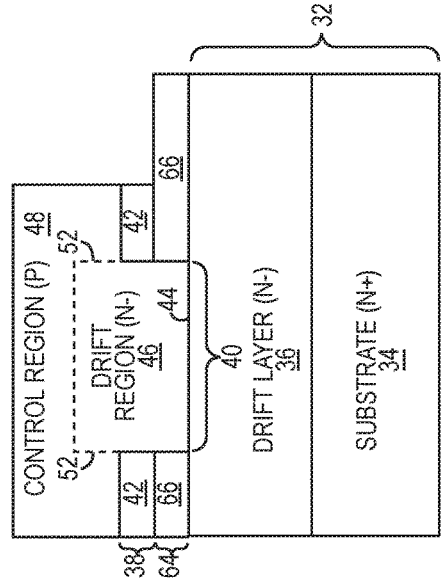
Figure 6H:
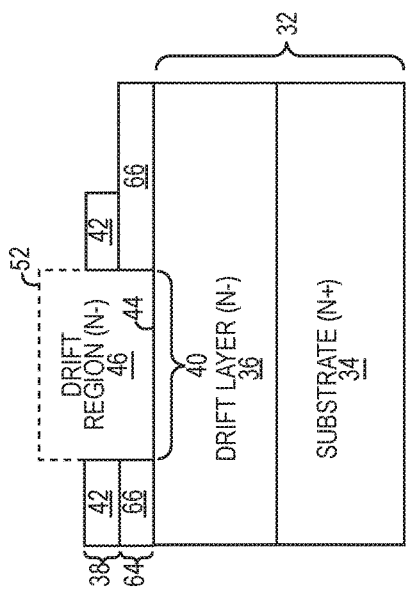
Figure 6I:
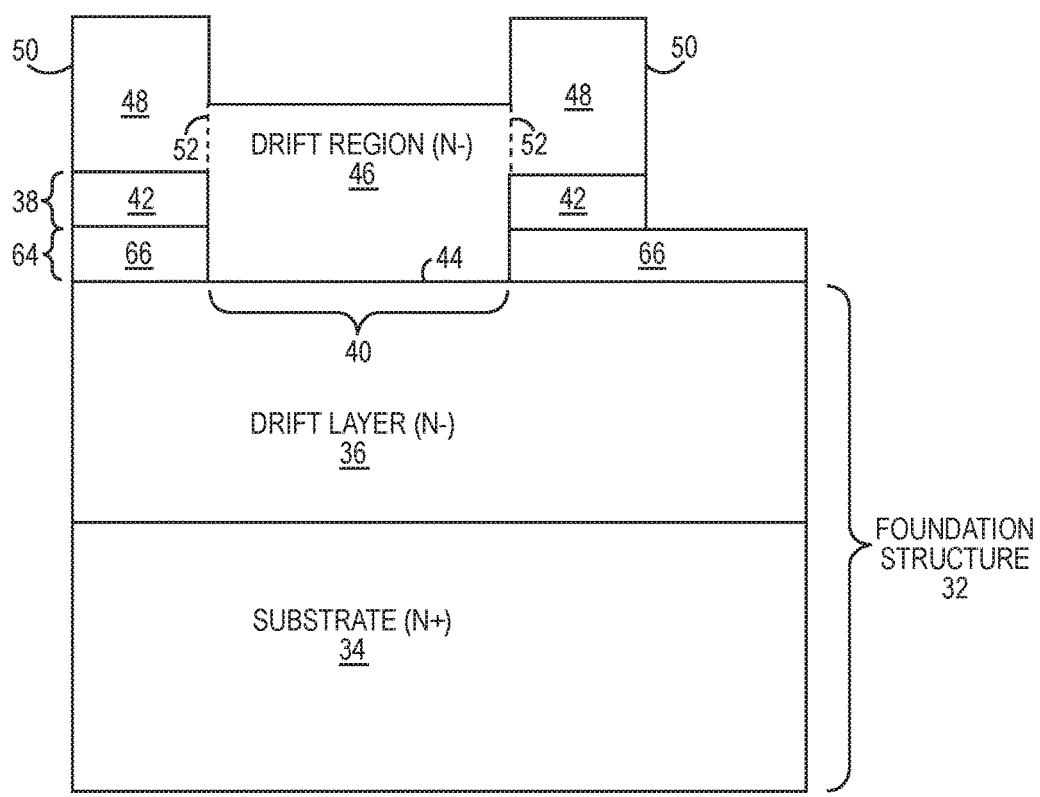

With reference to FIGS. 6G-6H, the first area 40 is then used as the horizontal regrowth interface 44 upon which the drift region 46 and the laterally adjacent control region 48 are grown during the continuous growth phase. Once the control region 48 is grown, a portion of the control region 48 may be removed to expose a top surface of the drift region 46, as illustrated in FIG. 6I. The exemplary vertical JFET 62 of FIG. 5 may be fabricated therefrom by attaching the drain contact 56 (D), the two gate contacts 58 (G), the supplemental gate contact 68 (G), and the source contact 60 (S) to the bottom surface of the substrate 34, the top surfaces of the control region 48, the exposed top surface of the supplemental control region 66, and the top surface of the drift region 46, respectively.

The materials and processes associated with fabricating the vertical JFET 54 illustrated in FIG. 4 may similarly be applied to fabricating the vertical JFET 62 illustrated in FIG. 5. Further, the supplemental control layer 64 may comprise materials such as p-GaN, p-AlGaN, p-InGaN, and may be formed using processes such as MOCVD and/or HVPE. Portions of the supplemental control layer 64 may be removed to form the supplemental control region 66 by processes such as reactive ion etching, for example. Chemistries used for etching the supplemental control layer 64 may include Cl2, BCl3, and/or Ar. The supplemental control region 66 of some embodiments may include GaN, AlGaN, and may be doped with a dopant such as Mg. In some embodiments, the supplemental control region 66 may have a vertical thickness ranging from 50 nm to 500 nm.

Figure 7:
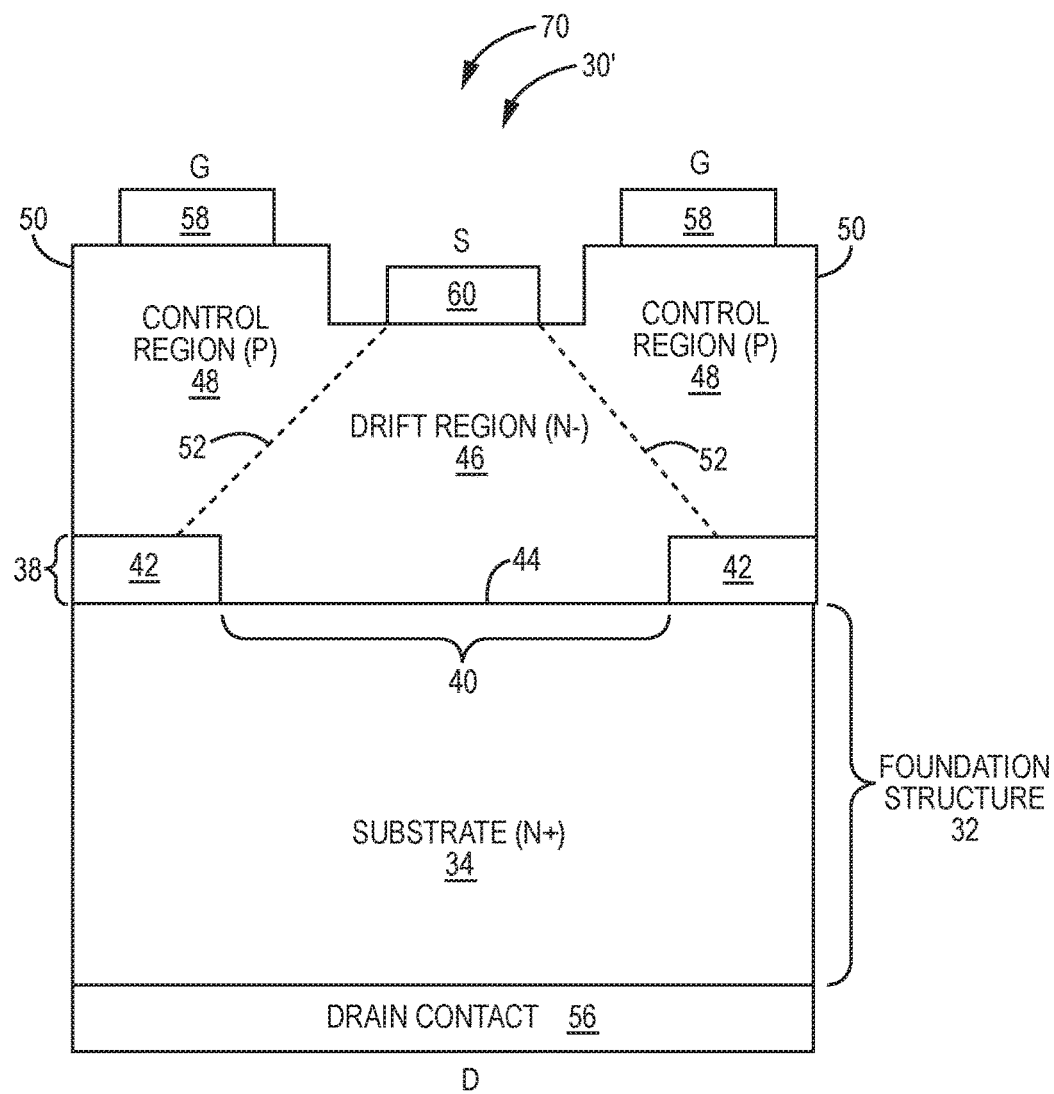
FIG. 7 is a schematic diagram of an exemplary vertical JFET having non-vertical PN junctions with no internal regrowth interfaces and including a precursor cell, drain, source, and gate contacts, and a PN structure grown directly on a substrate.

FIG. 7 illustrates an exemplary vertical JFET 70 formed from an alternative precursor cell 30' having the GaN PN structure 50 with no internal regrowth interfaces. The alternative precursor cell 30' used in the vertical JFET 70 differs from the precursor cell 30 used in the vertical JFET 54 illustrated in FIG. 4 and the vertical JFET 62 illustrated in FIG. 5 in several regards. The alternative precursor cell 30' used in the vertical JFET 70 has the PN junctions 52 that are non-vertical (i.e., not perpendicular to the plane of the top surface of the foundation structure 32). Further, the GaN PN structure 50 of the alternative precursor cell 30' is grown directly on the substrate 34 (i.e., the foundation structure 32 does not include the drift layer 36). In other regards, the alternative precursor cell 30' used to form the vertical JFET 70 is otherwise similar to the precursor cell 30 illustrated in FIG. 2.

FIGS. 8A-8F illustrate a process for fabricating the alternative precursor cell 30' used in the vertical JFET 70 of FIG.

Figure 8E:
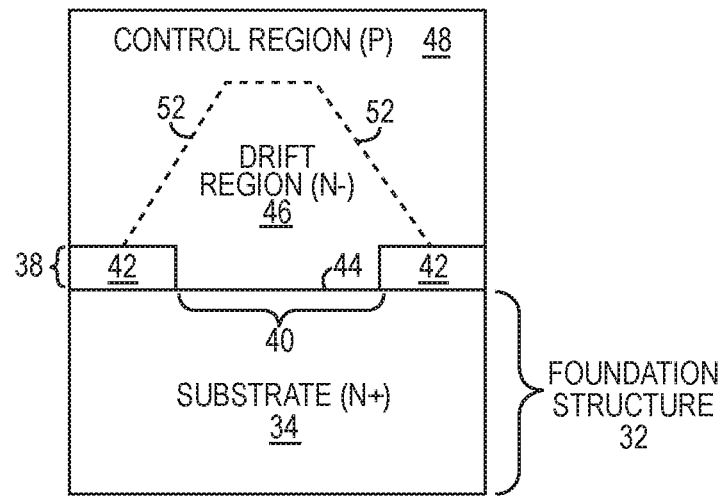

7. As shown in FIG. 8A, the substrate 34 is provided as the foundation structure 32. The mask layer 38 is then formed over the foundation structure 32. A portion of the mask layer 38 is then removed to expose the first area 40 of the top surface of the foundation structure 32 between the resultant mask structure 42. In contrast to the process for fabricating the precursor cell 30 illustrated in FIGS. 3A-3F, the process for fabricating the alternative precursor cell 30' used to form the vertical JFET 70 includes forming the mask layer 38 directly on the substrate 34. As shown in FIG. 8D, the drift region 46 is then formed over the first area 40 and directly on the substrate 34. Similar to the mask layer 38, the drift region 46 illustrated in FIG. 7 differs from the drift region 46 illustrated in FIG. 2 by being formed directly on the substrate 34, rather than on the drift layer 36 (which is not present in the embodiment illustrated in FIGS. 7 and 8A-8F).

Figure 8F:
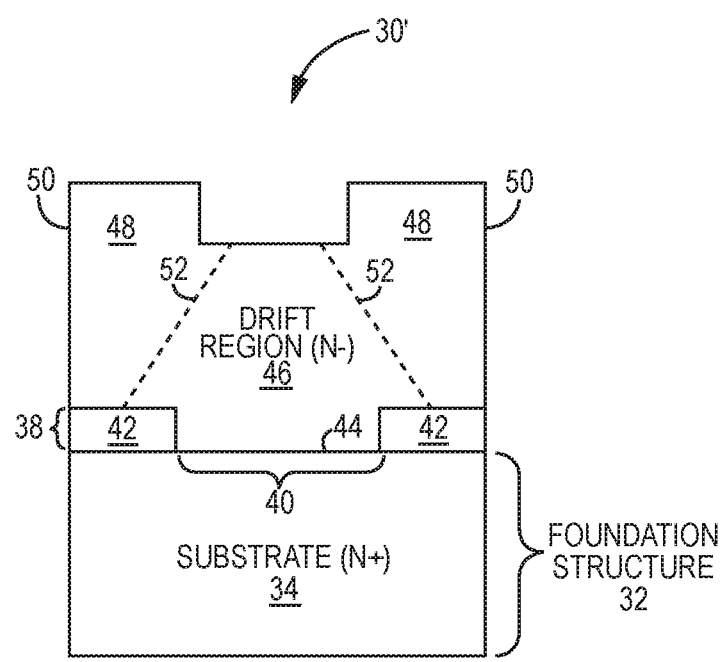

Further, as noted above, the alternative precursor cell 30' illustrated in FIG. 7 also differs from the precursor cell 30 illustrated in FIG. 2 in that the alternative precursor cell 30' has the non-vertical PN junctions 52. The non-vertical PN junctions 52 can be formed by controlling the growth of the drift region 46. For example, as illustrated in FIGS. 8D-8F, the non-vertical PN junctions 52 can be formed by regulating growth conditions of the drift region 46 in a MOCVD reactor and a choice of lateral growth facets/directions. This feature of the non-vertical PN junctions 52 can be included in at least the embodiments disclosed throughout the present disclosure. Forming the non-vertical PN junctions 52 does not affect device performance as the drift region 46 is newly regrown, and the GaN PN structure 50 is fabricated using the MOCVD and ELO techniques that provide the GaN PN structure 50 having no internal regrowth interfaces at the PN junctions 52.

Once the drift region 46 is formed, the control region 48 is formed over the drift region 46, and a portion of the control region 48 is removed to expose a top surface of the drift region 46, as illustrated in FIG. 8F. In this regard, the alternative precursor cell 30' is illustrated in FIG. 8F. The exemplary vertical JFET 70 may be fabricated by attaching the drain contact 56 (D), the two gate contacts 58 (G), and the source contact 60 (S) to the bottom surface of the substrate 34, the top surfaces of the control region 48, and the top surface of the drift region 46, respectively. In this manner, the vertical JFET 70 can be formed from the alternative precursor cell 30' having the GaN PN structure 50 with no internal regrowth interfaces.

Figure 9:
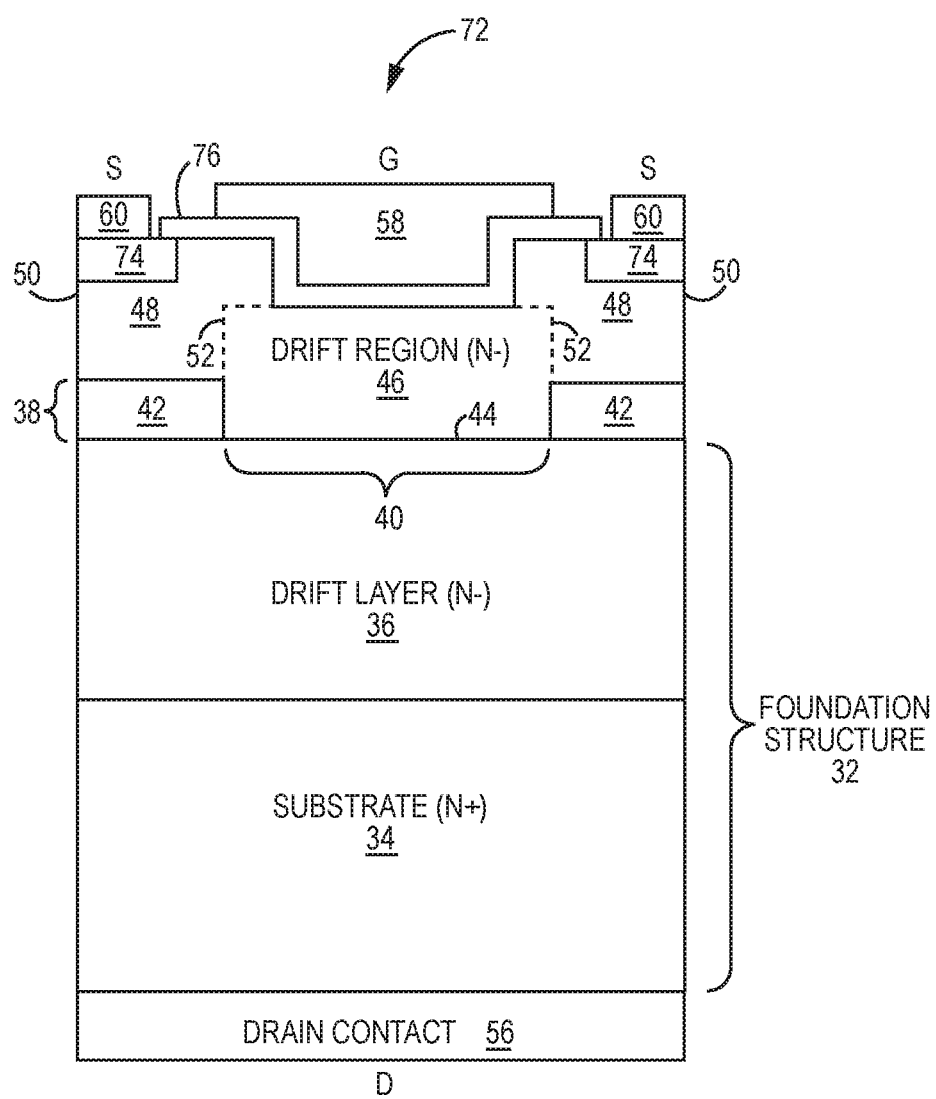
FIG. 9 is a schematic diagram of an exemplary vertical MOSFET having PN junctions with no internal regrowth interfaces and including a precursor cell, source regions, and drain, source, and gate contacts.

FIG. 9 illustrates an exemplary vertical MOSFET 72 formed from the precursor cell 30 illustrated in FIG. 2 having the PN junctions 52 with no internal regrowth interfaces. The vertical MOSFET 72 differs from the vertical JFET 54 of FIG. 4, the vertical JFET 62 of FIG. 5, and the vertical JFET 70 of FIG. 7 in that applying a positive bias to the gate contact 58 (G) of the vertical MOSFET 72 turns the vertical MOSFET 72 to its on-state.

Figures 10A, 10B:
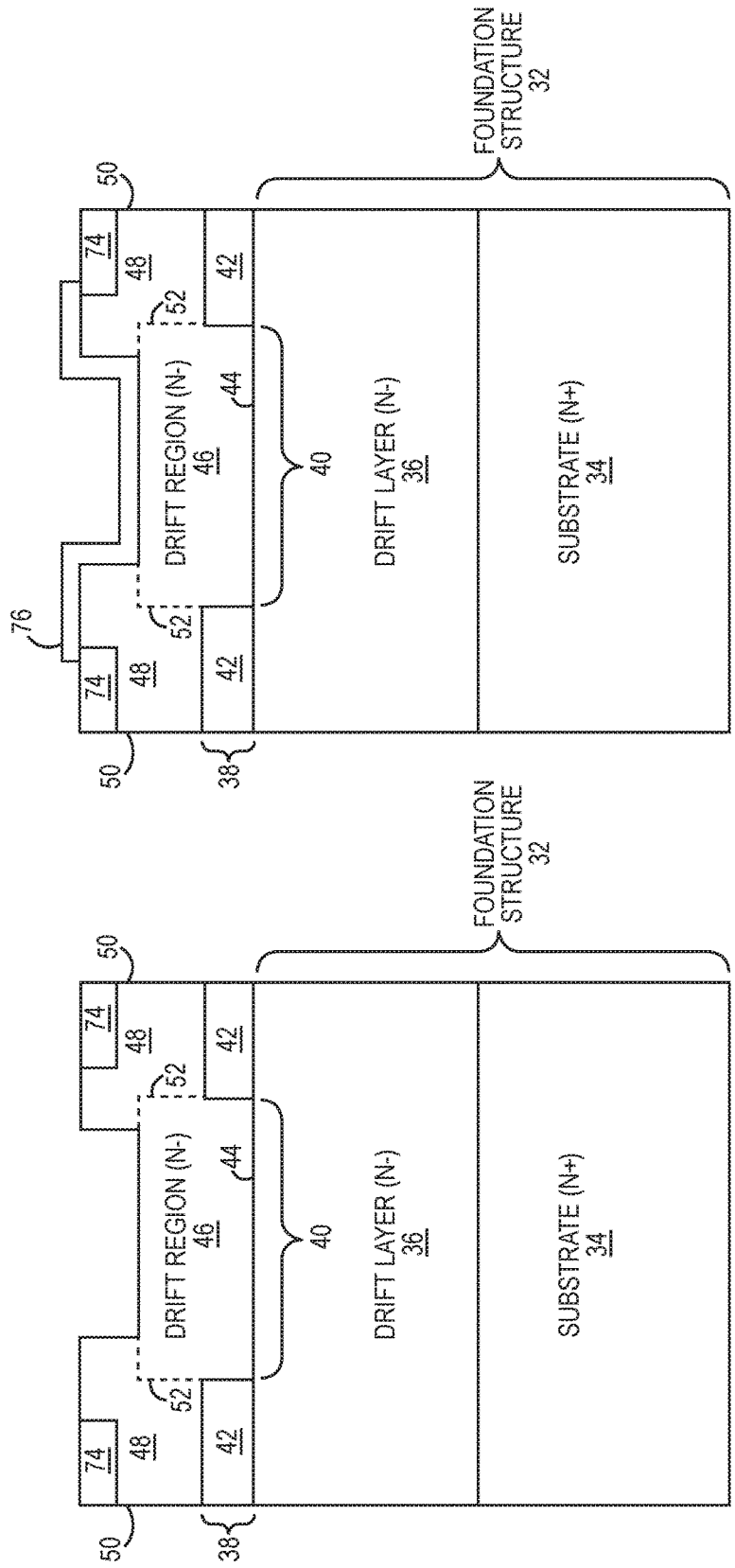
FIGS. 10A-10B illustrate an exemplary process for developing the precursor cell shown in FIG. 2 into the vertical MOSFET device illustrated in FIG. 9.

As illustrated in FIGS. 10A-10B, fabricating the vertical MOSFET 72 of FIG. 9 involves providing the precursor cell 30 illustrated in FIG. 2 and forming two N-doped source regions 74 in portions of the control region 48. FIG. 10B illustrates forming a dielectric layer 76 over a portion of the drift region 46. The vertical MOSFET 72 may be fabricated therefrom by attaching the drain contact 56 (D), one of the gate contacts 58 (G), and two source contacts 60 (S) to the bottom surface of the substrate 34, a top surface of the dielectric layer 76, and a portion of each of the source regions 74, respectively.

Some embodiments of the vertical MOSFET 72 illustrated in FIG. 9 include forming the source regions 74 using methods such as ion implantation and selective etching and epitaxial regrowth. In some embodiments disclosed herein, the source regions 74 may be doped with a dopant such as Si and/or Ge. In at least one of the above embodiments, doping processes may include MOCVD and/or MBE. Furthermore, in at least one embodiment, dopant levels may be greater than $2\times10^{18}$ cm$^{-3}$.

Those skilled in the art will recognize improvements and modifications to the preferred embodiments of the present disclosure. All such improvements and modifications are considered within the scope of the concepts disclosed herein and the claims that follow.

What is claimed is:

1. A precursor cell for a transistor comprising:
   a foundation structure;
   a mask structure over the foundation structure having an opening that exposes a first area of a top surface of the foundation structure; and
   a gallium nitride (GaN) PN structure disposed over the first area and at least a portion of the mask structure, the GaN PN structure having a continuous crystalline structure with no internal regrowth interfaces and comprising:
   a drift region doped with a first dopant of a first polarity over the first area; and
   a control region doped with a second dopant of a second polarity laterally adjacent the drift region, wherein the first polarity is opposite the second polarity and a PN junction is formed between the drift region and the control region.

2. The precursor cell of claim 1, further comprising a regrowth interface between the foundation structure and the GaN PN structure.

3. The precursor cell for the transistor of claim 1, wherein:
   the foundation structure comprises a substrate doped with a dopant of the first polarity; and
   the drift region and the mask structure are directly on the substrate.

4. The precursor cell of claim 3, further comprising a regrowth interface between the foundation structure and the GaN PN structure.

5. The precursor cell claim 4, further comprising:
   a drain contact over a bottom surface of the substrate, where the bottom surface of the substrate is opposite a top surface of the substrate;
   a gate contact over the control region; and
   a source contact over the drift region.

6. The precursor cell of claim 1, wherein the foundation structure comprises a substrate doped with a dopant of the first polarity and a drift layer doped with the dopant of the first polarity over the substrate.

7. The precursor cell claim 6 wherein the substrate and the drift layer comprise GaN.

8. The precursor cell of claim 7, further comprising a regrowth interface between the foundation structure and the GaN PN structure.

9. The precursor cell of claim 7, further comprising:
   a drain contact over a bottom surface of the substrate, where the bottom surface of the substrate is opposite a top surface of the substrate;
   a gate contact over the control region; and
   a source contact over the drift region.

10. The precursor cell of claim 7, further comprising:
the foundation structure further comprising a supplemental control region doped with a dopant of the second polarity over the drift layer;
a drain contact over a bottom surface of the substrate, where the bottom surface of the substrate is opposite a top surface of the substrate;
a gate contact over the control region;
a supplemental gate contact over the supplemental control region; and
a source contact over the drift region.

11. The precursor cell of claim 7, further comprising:
a source region doped with the dopant of the first polarity over at least a portion of the control region;
a dielectric layer over at least a portion of the drift region;
a drain contact over a bottom surface of the substrate, where the bottom surface of the substrate is opposite a top surface of the substrate;
a gate contact over the dielectric layer; and
a source contact over the source region.

12. The precursor cell of claim 11, further comprising a regrowth interface between the foundation structure and the GaN PN structure.

13. A method comprising:
providing a foundation structure doped with a dopant of a first polarity;
forming a mask structure over a top surface of the foundation structure, wherein the mask structure has an opening that exposes a first area of the top surface of the foundation structure; and
forming a gallium nitride (GaN) PN structure having a continuous crystalline structure with no internal regrowth interfaces over the first area and at least a portion of the mask structure in a continuous growth phase by regrowing a drift region of the GaN PN structure doped with the dopant of the first polarity in a substantially vertical direction over the first area and then growing a control region doped with a dopant of a second polarity in a substantially lateral direction such that the control region is laterally adjacent the drift region, wherein the first polarity is opposite the second polarity and a PN junction having no internal regrowth interfaces is formed between the drift region and the control region.

14. The method of claim 13, wherein a regrowth interface is provided between the foundation structure and the GaN PN structure.

15. The method of claim 13, further comprising forming the mask structure and the drift region directly on the foundation structure, wherein the foundation structure comprises a substrate doped with the dopant of the first polarity.

16. The method of claim 15, wherein a regrowth interface is provided between the foundation structure and the GaN PN structure.

17. The method of claim 13, wherein providing the foundation structure comprises providing a substrate doped with the dopant of the first polarity and forming a drift layer doped with the dopant of the first polarity over the substrate.

18. The method of claim 17, wherein a regrowth interface is provided between the foundation structure and the GaN PN structure.

19. The method of claim 13, further comprising using epitaxial lateral overgrowth (ELO) to promote a substantially lateral overgrowth of the GaN PN structure comprising simultaneously doping the control region with the dopant of the second polarity.

20. The method of claim 13, wherein regrowing the drift region in the substantially vertical direction comprises:
simultaneously doping the drift region with the dopant of the first polarity; and
using epitaxial lateral overgrowth (ELO) to promote a substantially lateral overgrowth of the GaN PN structure comprising simultaneously doping the control region with the dopant of the second polarity.

21. The method of claim 13, wherein the GaN PN structure is grown using metal-organic chemical vapor deposition (MOCVD) or Hydride Vapor Phase Epitaxy (HVPE).

* * * * *